(12) United States Patent
Liebendorfer

(10) Patent No.: US 11,672,080 B2
(45) Date of Patent: Jun. 6, 2023

(54) CURSOR CONTROL DEVICE WITH PRINTED TOUCH SENSOR

(71) Applicant: IDD Aerospace Corporation, Redmond, WA (US)

(72) Inventor: Mark Liebendorfer, Bellvue, WA (US)

(73) Assignee: IDD AEROSPACE CORPORATION, Redmond, WA (US)

( * ) Notice: Subject to any disclaimer, the term of this patent is extended or adjusted under 35 U.S.C. 154(b) by 0 days.

(21) Appl. No.: 17/762,721

(22) PCT Filed: Oct. 21, 2020

(86) PCT No.: PCT/US2020/056588
§ 371 (c)(1),
(2) Date: Mar. 22, 2022

(87) PCT Pub. No.: WO2021/081041
PCT Pub. Date: Apr. 29, 2021

(65) Prior Publication Data
US 2022/0400550 A1 Dec. 15, 2022

Related U.S. Application Data

(60) Provisional application No. 62/924,791, filed on Oct. 23, 2019.

(51) Int. Cl.
*G06F 3/033* (2013.01)
*H05K 1/09* (2006.01)
(Continued)

(52) U.S. Cl.
CPC ......... *H05K 1/092* (2013.01); *G06F 3/03547* (2013.01); *H05K 1/028* (2013.01); *H05K 3/12* (2013.01)

(58) Field of Classification Search
CPC ...... G06F 3/033; G06F 3/03547; G06F 3/041; G09G 5/00; H05K 1/02; H05K 1/092; H05K 3/12; H05K 2201/10151
See application file for complete search history.

(56) References Cited

U.S. PATENT DOCUMENTS 7,158,056 B2 * 1/2007 Wright .................. H03M 11/20
341/26
8,912,447 B2 * 12/2014 Leong ................ H03K 17/9622
174/254

(Continued)

FOREIGN PATENT DOCUMENTS

KR 20150130565 A * 11/2015

OTHER PUBLICATIONS

Ma et al., "Fabrication of Novel Transparent Touch Sensing Device via Drop-on-Demand Inkjet Printing Technique", ACS Applied Materials & Interfaces, vol. 7, No. 39, Sep. 24, 205, pp. 21628-21633.

(Continued)

*Primary Examiner* — Joe H Cheng
(74) *Attorney, Agent, or Firm* — Kilpatrick Townsend & Stockton LLP

(57) ABSTRACT

A touch sensor for a cursor control device includes a support layer, a first printed layer, and a second printed layer. The support layer includes a first surface and a second surface opposite from the first surface. The first printed layer includes a first conductive ink and is printed on the first surface of the support layer. The first printed layer includes a printed surface opposite from the support layer, and the printed surface of the first printed layer defines a touch area of the touch sensor. The second printed layer includes a second conductive ink and is printed on the printed surface of the first printed layer. The second printed layer is elec- (Continued)

trically connected to the first printed layer and forms a border around the touch area.

20 Claims, 5 Drawing Sheets

(51) Int. Cl.
*G06F 3/0354* (2013.01)
*H05K 1/02* (2006.01)
*H05K 3/12* (2006.01)

(56) References Cited

U.S. PATENT DOCUMENTS

| | | | | |
|---|---|---|---|---|
| 9,645,687 | B2* | 5/2017 | Heo | G06F 3/0446 |
| 9,772,727 | B2* | 9/2017 | Kim | G06F 3/0445 |
| 2010/0245246 | A1 | 9/2010 | Rosenfeld et al. | |
| 2011/0279398 | A1* | 11/2011 | Philipp | G06F 3/0446 |
| | | | | 345/174 |
| 2012/0113032 | A1* | 5/2012 | Itakura | G06F 3/0443 |
| | | | | 345/173 |
| 2013/0258570 | A1* | 10/2013 | Nashiki | G06F 3/045 |
| | | | | 361/679.01 |
| 2013/0269988 | A1 | 10/2013 | Wang et al. | |
| 2013/0277197 | A1* | 10/2013 | Mi | G06F 3/0445 |
| | | | | 200/600 |
| 2019/0025953 | A1* | 1/2019 | Ma | B32B 27/281 |

OTHER PUBLICATIONS

International Patent Application No. PCT/US2020/056588, International Search Report and Written Opinion, dated Feb. 10, 2021, 18 pages.

Salim et al., "Review of Recent Inkjet-Printed Capacitive Tactile Sensors", Sensors, vol. 17, No. 11, Nov. 10, 2017, pp. 1-20.

International Application No. PCT/US2020/056588, International Preliminary Report on Patentability dated May 5, 2022, 12 pages.

* cited by examiner

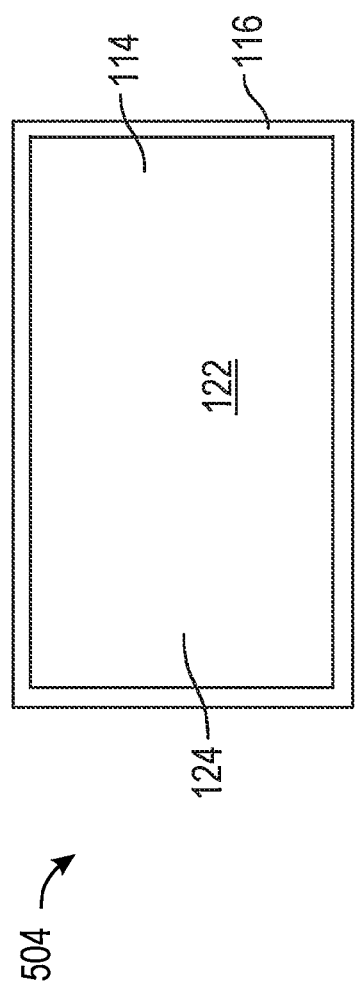

CURSOR CONTROL DEVICE WITH PRINTED TOUCH SENSOR

CROSS REFERENCE TO RELATED APPLICATION

This application is a National Stage of PCT/US2020/056588 filed on Oct. 21, 2020, which claims the benefit of U.S. Provisional Application No. 62/924,791, filed on Oct. 23, 2019, and entitled PRINTABLE CAPACITIVELY-COUPLED ANALOG TOUCH SENSOR, the content of which is hereby incorporated by reference in its entirety.

FIELD OF THE INVENTION

The field of the invention relates to cursor control devices, and, more particularly, to cursor control devices for vehicles.

BACKGROUND

Computer systems may include a cursor control device that allow a user to control the position of a cursor on a display. Some cursor control devices such as a mouse cursor control device require a relatively large amount of space to change the position of the cursor and/or may have a number of loose components. While such cursor control devices may be suitable for environments such as in an office, at school, or at home, they are unsuitable for use on moving vehicles such as aircraft. In particular, the components may become loose and move during movement of the vehicle, resulting in unintentional cursor movement. Additionally, vehicles may not have the space available to allow for movement of the cursor control devices. Existing cursor control devices may also be difficult to customize, require complex assembly, and may be difficult to repair and/or remove as needed.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

According to certain embodiments, a touch sensor for a cursor control device includes a support layer, a first printed layer, and a second printed layer. The support layer includes a first surface and a second surface opposite from the first surface. The first printed layer includes a first conductive ink and is printed on the first surface of the support layer. The first printed layer includes a printed surface opposite from the support layer, and the printed surface of the first printed layer defines a touch area of the touch sensor. The second printed layer includes a second conductive ink and is printed on the printed surface of the first printed layer. The second printed layer is electrically connected to the first printed layer and forms a border around the touch area.

In some embodiments, a resistivity of the second conductive ink of the second printed layer may be less than a resistivity of the first conductive ink of the first printed layer. In various embodiments, the second printed layer may form a continuous border around the touch area and may not cover the touch area. The support layer may also include a radiative plane layer on the second surface, and the support layer may include an electrically insulating substrate.

In various embodiments, the support layer may be a first support layer with a flexible substrate, and an adhesive layer may be on the second surface of the first support layer. The touch sensor further may include a second support layer. The second support layer may be rigid relative to the first support layer and may include a first surface and a second surface. The first support layer may be assembled with the second support layer such that the adhesive layer contacts and joins the first support layer with the second support layer. In some embodiments, the second support layer may include an electrically insulating substrate. In various embodiments, the touch sensor may also include at least one wire electrically connected to the second printed layer, and the at least one wire may be connectable with another piece of equipment.

According to certain embodiments, a cursor control device for a vehicle includes a housing and a touch sensor supported on the housing. The touch sensor includes a support layer, a first printed layer, and a second printed layer. The support layer includes a first surface and a second surface opposite from the first surface, and the first printed layer includes a first conductive ink that is printed on the first surface of the support layer. The first printed layer includes a printed surface opposite from the support layer, and the printed surface of the first printed layer defines a touch area of the touch sensor. The second printed layer includes a second conductive ink and is printed on the printed surface of the first printed layer. The second printed layer is electrically connected to the first printed layer, and a resistivity of the second printed layer is less than a resistivity of the first printed layer.

In some embodiments, the second printed layer may form a continuous border around the touch area and may not cover the touch area. In various embodiments, the support layer may include an electrically insulating substrate. The touch sensor may also include a radiative plane layer on the second surface of the support layer, and the radiative plane layer may be electrically connected to the first printed layer and the second printed layer via the support layer.

In various embodiments, the touch sensor further may include a protective layer, and the protective layer may include an electrically insulating ink printed on the touch area of the first printed layer and within a border defined by the second printed layer. In certain embodiments, the support layer may be a first support layer with a flexible substrate and an adhesive layer on the second surface of the first support layer, and the touch sensor may also include a second support layer. In various embodiments, the second support layer may be rigid relative to the first support layer and may include a first surface and a second surface. The first support layer may be assembled with the second support layer such that the adhesive layer contacts and joins the first support layer with the second support layer.

In certain embodiments, the touch sensor may include a plurality of wires electrically connected to the second printed layer and extending away from the touch sensor. In some embodiments, the housing may include a base, a support surface extending upwards from the base at an oblique angle, and a palm support, and the touch sensor may be supported on the support surface.

According to certain embodiments, a method of assembling a touch sensor for a cursor control device includes providing a support layer having a first surface and a second surface opposite from the first surface, and printing a first conductive ink on the first surface of the support layer. Printing the first conductive ink on the first surface forms a first printed layer with a printed surface, and the printed surface defines a touch area of the touch sensor. The method includes printing a second conductive ink on the printed surface as a border surrounding the touch area. Printing the second conductive ink forms a second printed layer, and the second printed layer does not cover the touch area of the printed surface.

In some embodiments, providing the support layer may include printing the support layer. In various embodiments, printing at least one of the first conductive ink or the second conductive ink includes at least one of contact printing or non-contact printing. In certain embodiments, printing the second conductive ink may include printing the second conductive ink on the printed surface as a continuous border surrounding the touch area.

In various embodiments, the support layer may be a first support layer with a flexible substrate and an adhesive layer on the second surface, and the method may include positioning the first support layer on a second support layer after printing the first conductive ink and after printing the second conductive ink on the first support layer. In some embodiments, the second support layer may be rigid relative to the first support layer and may include an insulating substrate. Positioning the first support layer may include engaging the adhesive layer with the second support layer such that the adhesive layer joins the first support layer with the second support layer.

Various implementations described herein can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

FIG. 7 is a top view of the printed touch sensor of FIG. 5.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Directional references such as "up," "down," "top," "bottom," "left," "right," "forward," and "aft," among others, are intended to refer to the orientation as illustrated and described in the figure (or figures) to which the components and directions are referencing.

The described embodiments of the invention provide touch sensors for cursor control devices. In certain embodiments, the cursor control devices are for use in a vehicle, including, but not limited to, an aircraft. While the touch sensors and cursor control devices are discussed for use with aircraft, they are by no means so limited. Rather, embodiments of the touch sensors and cursor control devices may be used in vehicles of any type or otherwise as desired, or may be used in other environments or applications not involving a vehicle.

Figure 1:
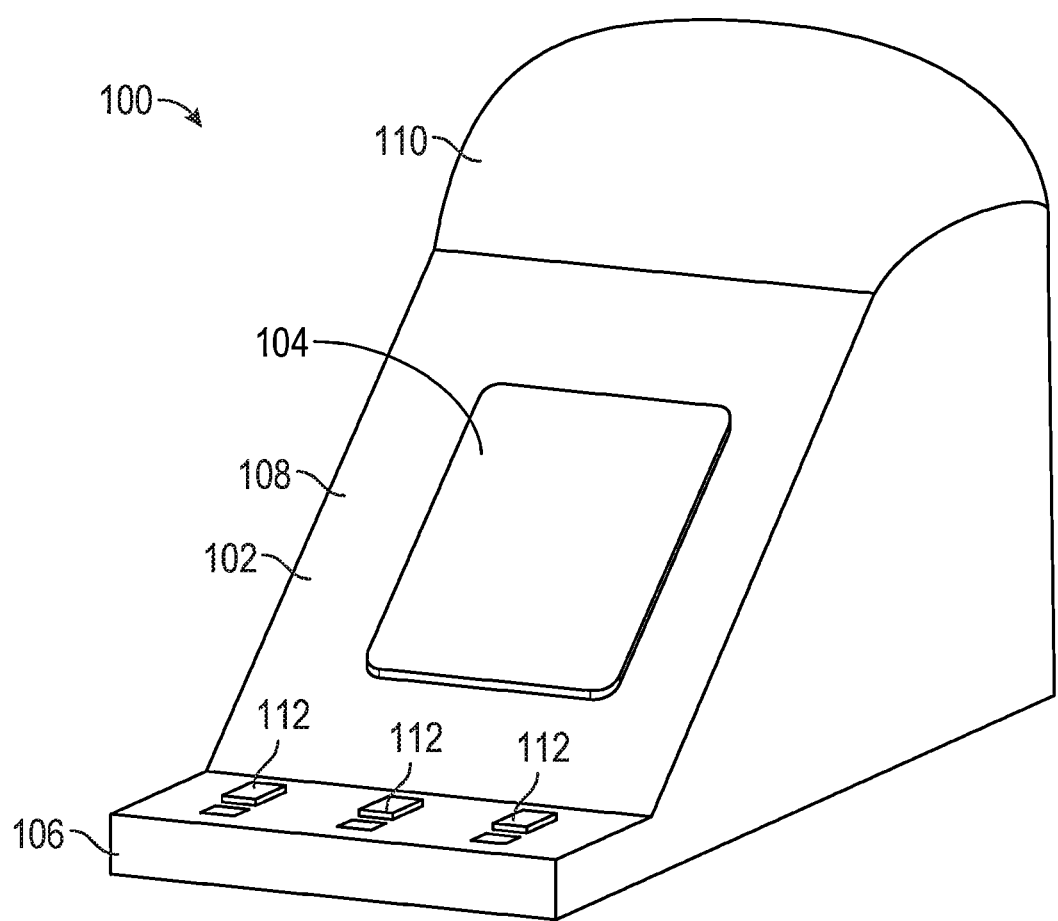
FIG. 1 is a perspective view of a cursor control device with a printed touch sensor according to embodiments of the invention.

According to certain embodiments of the invention, as shown in FIG. 1, a cursor control device 100 includes a housing 102 and a touch sensor 104 supported on the housing 102. The cursor control device 100 is designed for use in a cockpit of an aircraft, but as mentioned, the touch sensor 104 and/or cursor control device 100 may be used in other types of vehicles and/or in applications that do not involve a vehicle.

The housing 102 includes a base 106 and a support surface 108 extending upwards and at an oblique or other angle relative to a plane of the base 106. In certain embodiments, the touch sensor 104 is supported on the support surface 108. Optionally, the cursor control device 100 may include a palm support 110, various buttons or switches 112, and/or other components as desired. The particular cursor control device 100 illustrated in FIG. 1 should not be considered limiting, and the touch sensor 104 may be provided on various other cursor control devices having other shapes, dimensions, components, or arrangement of components as desired. When the cursor control device 100 is provided in a particular location, including, but not limited to, in an aircraft, a user may use the cursor control device 100 by engaging at least the touch sensor 104 (e.g., with the user's finger(s)) to move and/or position a cursor on a screen of an associated computer display (not illustrated in FIG. 1).

Figure 2:
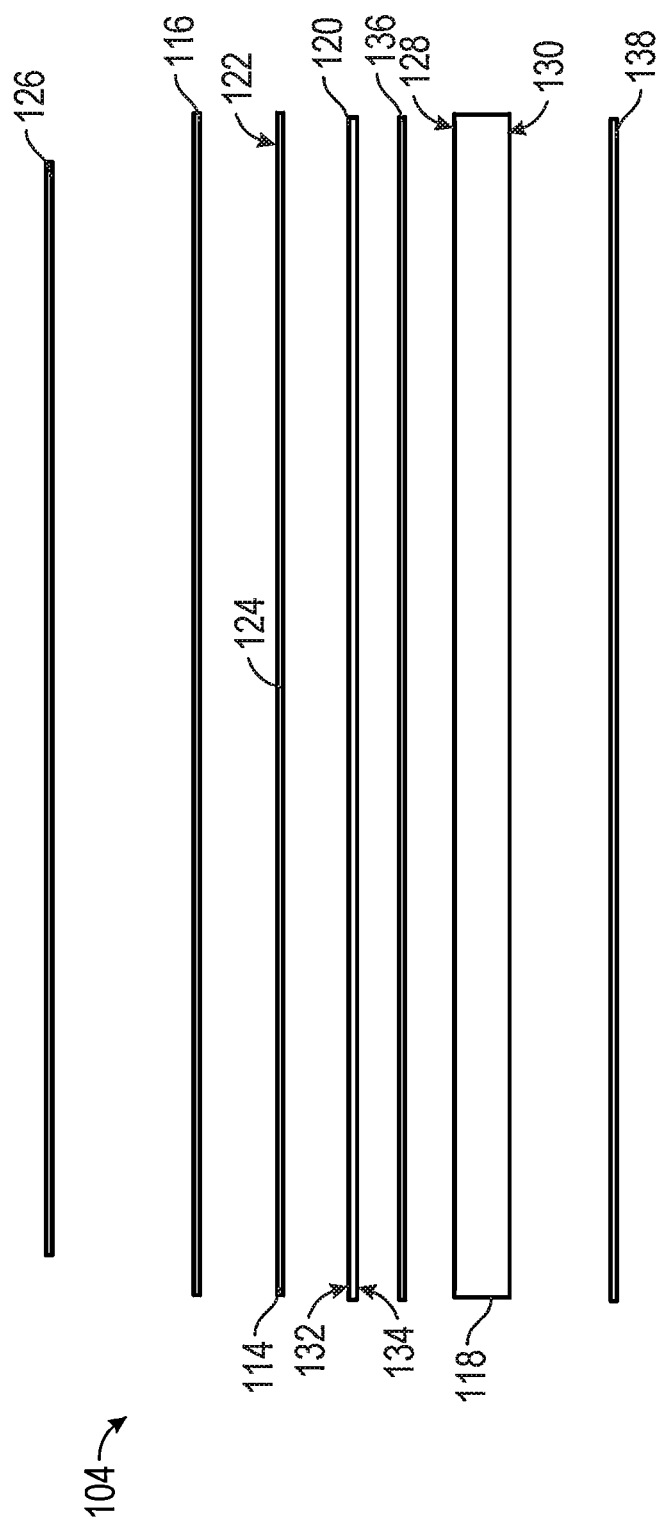
FIG. 2 is an exploded side view showing the layers of the printed touch sensor of FIG. 1.
Figure 3:
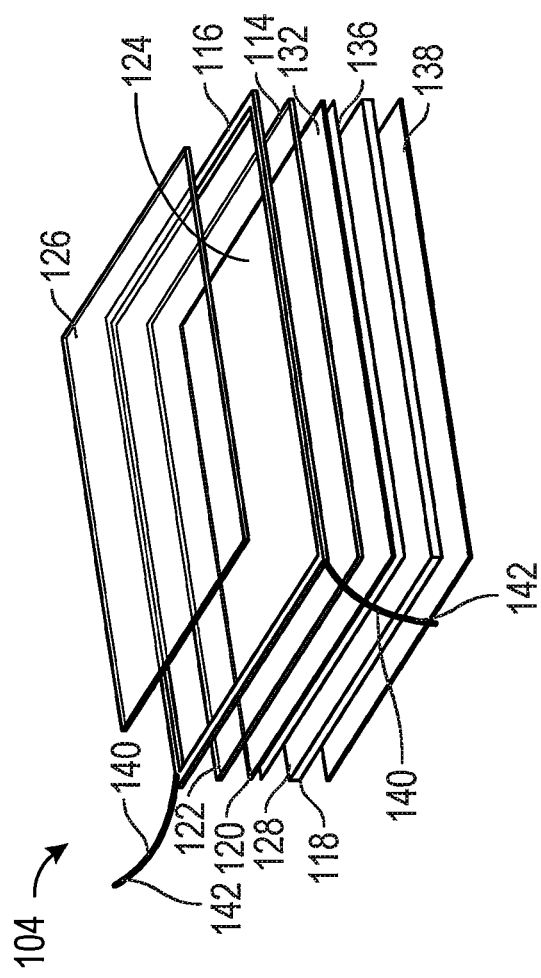
FIG. 3 is an exploded perspective view of the printed touch sensor of FIG. 1.

As best illustrated in FIGS. 2 and 3, the touch sensor 104 generally includes a first printed layer 114, a second printed layer 116, and at least one of a rigid support layer 118 or a flexible support layer 120 (or both the rigid support layer 118 and the flexible support layer 120). In various embodiments, the first printed layer 114 provides a touch area having a uniform resistance, and the second printed layer 116 provides a border of distributed resistance around the touch area. The touch sensor 104 with the first printed layer 114 and the second printed layer 116 may have no moving parts required to move or change the position of a cursor on a screen. The touch sensor 104 may also have a reduced thickness, reduced number of components, and improved structure for customization, assembly, maintenance, and removal compared to existing touch sensors. As one non-limiting example, the first printed layer 114 and the second printed layer 116 may allow for the touch sensor 104 to be assembled with a reduced thickness compared to existing touch sensors while providing at least the same, and in some cases improved, functionality. As another non-limiting example, the first printed layer 114 and the second printed layer 116 may allow for the provision of the functioning touch sensor 104 while omitting materials or components typically found in existing touch sensors, including but not limited to resistors, a layer of indium-tin-oxide, etc. As an additional non-limiting example, the first printed layer 114 and the second printed layer 116 may allow for improved assembly and customization because particular conductive inks may be selected for the layers 114, 116 as desired and depending on application, and during the assembly process, a type of conductive ink may be easily changed or replaced as desired. The printed layers 114, 116 may also allow for optical features (as well as other features) to be incorporated into the layers as sub-layers, which may improve the appearance and functionality of the touch sensor 104 compared to existing sensors. As another non-limiting example, the first printed layer 114 and the second printed layer 116 may allow for improved assembly and/or removal because the printed layers 114, 116 may be assembled separately from other components of the cursor control device 100 (and may be mass produced at once) and later assembled with the cursor control device 100 as desired. The particular shape of the touch sensor 104 illustrated in FIGS. 1-4 should not be considered limiting on the current disclosure, as the touch sensor 104 may have various suitable shapes as desired. In certain embodiments, the touch sensor 104 may have a shape that facilitates corresponding cursor motion on a screen associated with the touch sensor 104.

The first printed layer 114 and the second printed layer 116 each include a printable, electrically conductive ink. In various cases, the electrically conductive ink may include a polymer filled with semi-conductors, although various other compositions or types of printable, electrically conductive inks may be utilized. In various embodiments, a resistivity of the electrically conductive ink of the first printed layer 114 and/or the second printed layer 116 may be tunable/adjustable as desired to have a desired resistivity. Optionally, the resistivity may be adjusted or tuned depending on a particular application of the touch sensor 104.

In certain examples, the electrically conductive ink of the first printed layer 114 is different from the electrically conductive ink of the second printed layer 116. In some examples, the first printed layer 114 has a first electrically conductive ink and the second printed layer 116 has a second electrically conductive ink such that a resistivity of the first printed layer 114 is greater than a resistivity of the second printed layer 116. In one non-limiting example, the first electrically conductive ink may be a conductive ink such as LOCTITE® M 2023 POL E&C (Henkel, Dusseldorf, Germany), and the second electrically conductive ink may be a conductive ink such as LOCTITE® M 2010 RS E&C (Henkel, Dusseldorf, Germany).

While the first printed layer 114 and the second printed layer 116 are each illustrated as a single layer in FIGS. 2 and 3, in certain embodiments, the first printed layer 114 and/or the second printed layer 116 may include one or more sub-layers in the thickness and/or along the length and/or the width. In embodiments with sub-layers, at least one characteristic of one sub-layer may optionally be different from another sub-layer. As one non-limiting example, a first sub-layer of the first printed layer 114 may include an image or logo such that the image or logo may appear in a portion of the first printed layer 114 (e.g., in a portion of a touch area 124). As another non-limiting example, a first sub-layer of the first printed layer 114 may include a diffusing pattern and/or optical modifications to diffuse glare and/or otherwise provide a particular surface appearance. As a further non-limiting example, a first sub-layer of the first printed layer 114 may include a texture or surface modification and a second sub-layer may be flat and/or smooth to provide a particular feel in different regions of the touch area 124. Various other characteristics and/or sub-layers may be utilized as desired. In some cases, the at least one sub-layer with the different characteristic may be the topmost layer, although it need not be in other examples.

Figure 5:
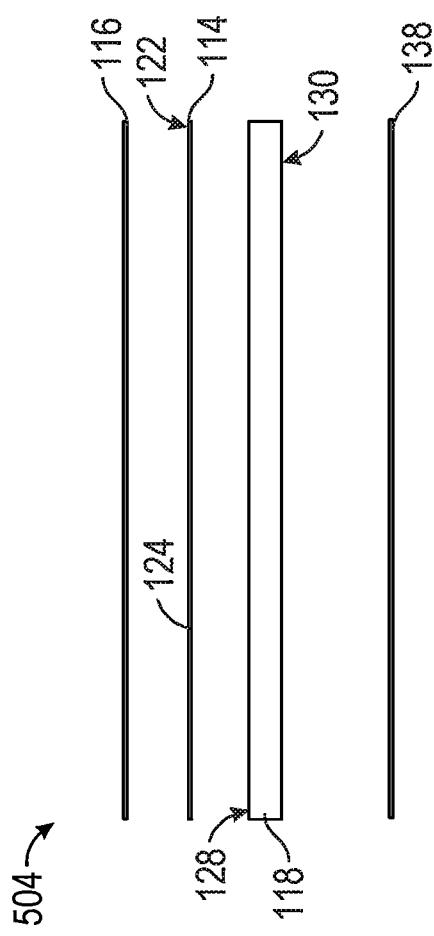
FIG. 5 is an exploded side view of another embodiment of a printed touch sensor for a cursor control device according to embodiments.
Figure 6:
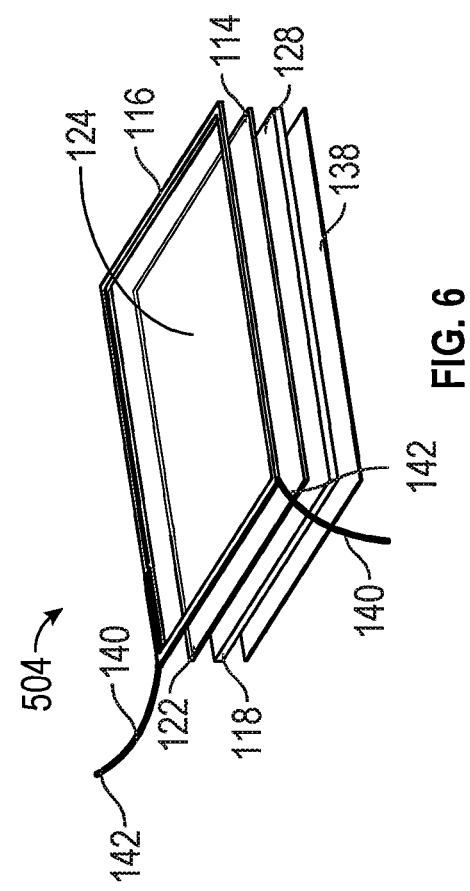
FIG. 6 is an exploded perspective view of the printed touch sensor of FIG. 5.

The first printed layer 114 is printed on the rigid support layer 118 or the flexible support layer 120 and in electrical communication (e.g., able to send/receive electrical signals) with the rigid support layer 118 or the flexible support layer 120 (discussed in detail below), and the second printed layer 116 is printed on the first printed layer 114 and in electrical communication with the first printed layer 114. In the embodiment of FIGS. 2 and 3, the first printed layer 114 is printed on the flexible support layer 120. In the embodiment of FIGS. 5-7, the first printed layer 114 is printed on the rigid support layer 118. The first printed layer 114 and the second printed layer 116 may each be assembled via various suitable contact or non-contacting printing techniques as desired, and the technique used to print the first printed layer 114 need not be the same as the technique used to print the second printed layer 116. Printing techniques suitable for assembling the first printed layer 114 and/or the second printed layer 116 include, but are not limited to, screen printing, flexographic printing, gravure printing, soft lithographic printing, laser direct writing, aerosol jet printing, inkjet printing, other contact printing techniques, other non-contact printing techniques, or combinations thereof.

Referring to FIGS. 2 and 3, the first printed layer 114 includes a printed surface 122 that is opposite from the support layer on which the first printed layer 114 is printed (in FIGS. 2 and 3, opposite from the flexible support layer 120). A portion of the printed surface 122 defines the touch area 124 of the touch sensor 104 that the user can contact and engage with to move the cursor on the screen of the associated display. As illustrated in FIGS. 2 and 3, the second printed layer 116 is printed on the printed surface 122 such that the second printed layer 116 forms a border around the touch area 124 and defines the boundary of the touch area 124. In certain embodiments, and as best illustrated in FIG. 3, the second printed layer 116 forms a continuous border surrounding the touch area 124 of the printed surface 122 of the first printed layer 114. In various embodiments, the second printed layer 116 is printed on the first printed layer 114 such that the second printed layer 116 does not cover the touch area 124.

Figure 4:
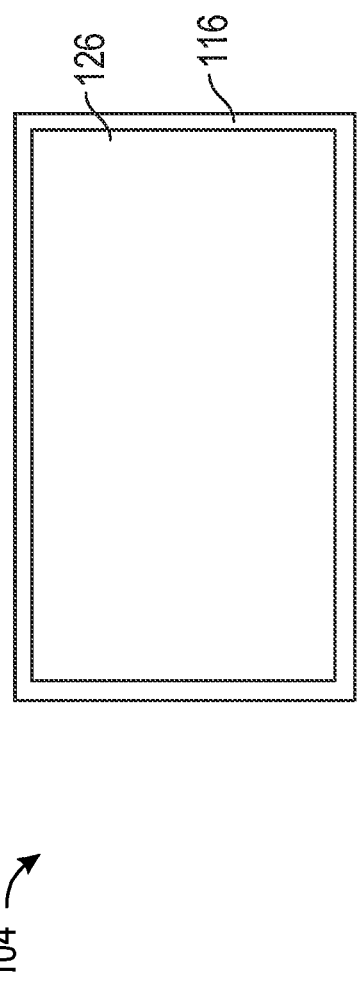
FIG. 4 is a top view of the printed touch sensor of FIG. 1.

Optionally, and as illustrated in FIGS. 2-4, the touch sensor 104 includes a protective layer 126 that covers the touch area 124 of the printed surface 122 of the first printed layer 114. In embodiments with the protective layer 126, the second printed layer 116 may surround the protective layer 126 on the printed surface 122. In some embodiments, the protective layer 126 is constructed from various materials suitable for protecting the touch area 124 from abrasion and/or contamination. Optionally, the protective layer 126 may be constructed from an electrically insulating material. In some cases, the protective layer 126 may be a printable, electrically insulating ink that is printed on the touch area 124 of the first printed layer 114. However, in other embodiments, the protective layer 126 need not be printed and may be formed via various other suitable techniques for forming a protective layer as desired. In yet other embodiments, the protective layer 126 may be omitted (see, e.g., FIGS. 5-7).

As mentioned, the touch sensor 104 includes at least one of the rigid support layer 118 or the flexible support layer 120. In the embodiment of FIGS. 2-4, the touch sensor 104 includes both the rigid support layer 118 and the flexible support layer 120. FIGS. 5-7 illustrate another embodiment of a touch sensor 504 that is substantially similar to the touch sensor 104 except that the touch sensor 504 omits the flexible support layer 120. Likewise, it will be appreciated that in other embodiments, a touch sensor may omit the rigid support layer 118 and include the flexible support layer 120.

The rigid support layer 118 and the flexible support layer 120 may each be constructed from materials suitable for receiving and supporting at least the first printed layer 114 and the second printed layer 116. In various embodiments, the rigid support layer 118 may be constructed from a material that is more rigid than a material of the flexible support layer 120. As some non-limiting examples, the rigid support layer 118 may be constructed from various materials including, but not limited to, glass, reinforced polymers (with or without flame retardant), acrylic, polycarbonate, other materials as desired, or combinations thereof. The flexible support layer 120 may be constructed from various materials including, but not limited to, polymers such as polyimide, polyethylene terephthalate, polyethylene naphthalate, polycarbonate, polydimethylsiloxane, polyurethane, thermoplastic polyurethane, and/or other suitable flexible materials or combinations of materials as desired. In one non-limiting example, the rigid support layer 118 may be an etched or printed circuit board (PCB) or glass, and the flexible support layer 120 may be a polyethylene terephthalate film. In certain embodiments, at least one of the support layers may be a dielectric or electrically insulating layer. In the embodiment of FIGS. 2-4, the rigid support layer 118 is glass and is an electrically insulating layer.

The rigid support layer 118 and/or the flexible support layer 120 may each be formed via various suitable techniques or processes as desired. In some non-limiting examples, the rigid support layer 118 and/or the flexible support layer 120 may optionally be formed via a printing technique similar to or different from that used to print the first printed layer 114 and/or the second printed layer 116. In other embodiments, the rigid support layer 118 and/or the flexible support layer 120 need not be formed by a printing technique. The rigid support layer 118 and/or the flexible support layer 120 need not be formed by the same technique.

In various embodiments, the rigid support layer 118 includes a first surface 128 and a second surface 130 opposite from the first surface 128. Similarly, the flexible support layer 120 includes a first surface 132 and a second surface 134 opposite from the first surface 132. In certain embodiments, a thickness of the rigid support layer 118 is greater than a thickness of the flexible support layer 120. In various embodiments, the thickness of the rigid support layer 118 and/or the thickness of the flexible support layer 120 may predetermined based on a desired use for the touch sensor 104.

As previously mentioned, in the embodiment of FIGS. 2-4, the first printed layer 114 is printed on the first surface 132 of the flexible support layer 120. In various embodiments, an adhesive layer 136 is optionally provided on the second surface 134 of the flexible support layer 120. In other embodiments, the adhesive layer 136 may be omitted from the flexible support layer 120. The adhesive layer 136 may be various suitable materials for joining the flexible support layer 120 with another component such as the rigid support layer 118. In certain embodiments, printing the first printed layer 114 on the flexible support layer 120 (rather than the rigid support layer 118) may allow for the printed layers 114, 116 to be printed, die cut, or otherwise formed and later applied to the target location (e.g., in a cockpit). In this embodiment, the adhesive layer 136 may be on a bottom surface of the flexible support layer 120 (i.e., opposite from the printed layers) such that the touch sensor 104 may be a "sticker" that can be positioned at various locations as desired. In the embodiment of FIGS. 2-4, the adhesive layer 136 contacts and engages the second surface 134 of the flexible support layer 120 and the first surface 128 of the rigid support layer to join the flexible support layer 120 (and printed layers) with the rigid support layer 118.

Optionally, and as best illustrated in FIGS. 2 and 3, the touch sensor 104 may include a radiative plane layer 138 attached to the second surface 130 of the rigid support layer 118. The radiative plane layer 138 may reflect or otherwise provide an electrical signal to the printed layers that interacts with the user's fingers when the touch sensor 104 is used such that the user's touch of the touch sensor 104 may be converted to another electrical signal that moves the cursor on the associated display, and/or the radiative plane 138 may serve as a return path for a signal (e.g., when the user's fingers touch the touch area). In these embodiments, the radiative plane layer 138 may be capacitively coupled to the first printed layer 114 and/or the second printed layer 116 via the rigid support layer 118 (and/or the flexible support layer 120). The radiative plane layer 138 may be constructed from various materials suitable for providing a signal that interacts with a user's fingers when the touch sensor 104 is touched. As one non-limiting example, the radiative plane layer 138 may include a metal such as copper. As another non-limiting example, the radiative plane layer 138 may include a printable, electrically conductive ink such as LOCTITE® M 2001RS E&C (Henkel, Dusseldorf, Germany). When the touch sensor 104 is used, the radiative plane layer 138 may receive an electrical signal (e.g., from a control circuit or other suitable controller) which capacitively couples to the first printed layer 114 and/or the second printed layer 116. In an absence of a user's touch, the signal affects all areas equally, while a user's touch in any location causes an imbalance that can be measured and used to control the position of the cursor on the screen of the associated display.

As best illustrated in FIG. 3, in various embodiments, the touch sensor 104 may include electrical connectors 140 extending from the touch sensor 104. In various aspects, the electrical connector(s) 140 may electrically connect the touch sensor 104 with another component such that the touch sensor 104 can send and receive signals from the other component. As one non-limiting example, the electrical connector(s) 140 may electrically connect the touch sensor 104 to a controller of the cursor control device 100. The electrical connectors 140 have been omitted from FIGS. 2 and 4 for clarity of the figures, respectively.

The electrical connector(s) 140 may be attached to various locations on the touch sensor 104 as desired, covering different amounts of areas, and/or in various other configurations or patterns as desired. In some embodiments, the electrical connector(s) 140 may be attached to the second printed layer 116 (see, e.g., FIG. 3). In certain embodiments, if the rigid support layer 118 is a PCB, the electrical connector(s) 140 may optionally be attached to solder pads on the PCB. In various embodiments, and as illustrated in FIG. 3, the electrical connector(s) 140 may be attached to a corner of the touch sensor 104; however, in other embodiments, the electrical connector(s) 140 need not be at the corners of the touch sensor 104. As a non-limiting example, in some embodiments, the electrical connector(s) 140 may be arranged in a linear pattern, circular pattern, at non-corner portions of the touch sensor (e.g., along edges or at an internal location), etc. as desired. The electrical connector(s) 140 may be attached to the touch sensor 104 via various suitable attachment mechanisms as desired. In the embodiment of FIG. 3, the electrical connector 140 is attached to the touch sensor using conductive epoxy.

In FIG. 3, two electrical connectors 140 is shown, but in other examples, any number of electrical connectors 140 may be utilized as desired to electrically connect the touch sensor 104 with other equipment or components as desired. As a non-limiting example, the touch sensor 104 may include a single electrical connector 140, three electrical connectors 140, four electrical connectors 140, or more than four electrical connectors 140. In the embodiment of FIG. 3, the electrical connectors 140 are wires 142; however, in other embodiments, other suitable electrical connectors may be utilized as desired. As a non-limiting example, in other embodiments, the touch sensor 104 may include one or more conductive flaps or copper traces in place of the wires 142.

FIGS. 5-7 illustrate another embodiment of the touch sensor 504 that is substantially similar to the touch sensor 104 except that the touch sensor 504 omits the flexible support layer 120 and the protective layer 126. In the embodiment of FIGS. 5-7, the first printed layer 114 is printed on the first surface 128 of the rigid support layer 118.

A method of assembling a touch sensor is also provided. Referring to FIGS. 2-4, in various embodiments, the method may include providing a support layer having a first surface and a second surface opposite from the first surface, and printing the first conductive ink on the first surface of the support layer to form the first printed layer 114.

In some embodiments, providing the support layer may include providing the flexible support layer 120. In these embodiments, printing the first conductive ink includes printing on the first surface 132 of the flexible support layer 120. In various embodiments, providing the support layer may include providing the rigid support layer 118, and printing the first conductive ink includes printing on the first surface 128 of the rigid support layer 118. Printing the first conductive ink to form the first printed layer 114 on either the flexible support layer 120 or the rigid support layer 118 may include, but is not limited to, screen printing, flexographic printing, gravure printing, soft lithographic printing, laser direct writing, aerosol jet printing, inkjet printing, other contact printing techniques, other non-contact printing techniques, or combinations thereof. Optionally, providing the support layer may include printing the support layer via a printing technique, which may be the same as or different from the printing technique used to print the first printed layer 114.

The method includes printing the second conductive ink on the first printed layer 114 to form the second printed layer 116. Printing the second conductive ink may utilize a printing technique which may be the same as or different from the printing technique used to print the first printed layer 114. In various embodiments, printing the second conductive ink may include forming the second printed layer 116 as a border around the touch area 124 of the first printed layer 114, and in certain embodiments, the border is a continuous border.

In embodiments where the first conductive ink is printed on the flexible support layer 120, the method may include attaching the flexible support layer 120 to the rigid support layer 118 (or other suitable location) after forming the first printed layer 114 and the second printed layer 116. Optionally, the method includes printing the protective layer 126 on at least the touch area 124 of the first printed layer 114. Optionally, in various embodiments, the radiative plane layer 138 may be assembled with the rigid support layer 118 before printing the first printed layer 114 and/or the second printed layer 116, or the radiative plane layer 138 may be attached after the printing of the first printed layer 114 and/or the second printed layer 116.

A collection of exemplary embodiments are provided below, including at least some explicitly enumerated as "Illustrations" providing additional description of a variety of example embodiments in accordance with the concepts described herein. These examples are not meant to be mutually exclusive, exhaustive, or restrictive; and the disclosure not limited to these examples but rather encompasses all possible modifications and variations within the scope of the issued claims and their equivalents.

Illustration 1. A touch sensor for a cursor control device, the touch sensor comprising: a support layer comprising a first surface and a second surface opposite from the first surface; a first printed layer comprising a first conductive ink, wherein the first printed layer is printed on the first surface of the support layer and comprises a printed surface opposite from the support layer, and wherein the printed surface of the first printed layer defines a touch area of the touch sensor; and a second printed layer comprising a second conductive ink, wherein the second printed layer is printed on the printed surface of the first printed layer and is electrically connected to the first printed layer, and wherein the second printed layer forms a border around the touch area.

Illustration 2. The touch sensor of any preceding or subsequent illustrations or combination of illustrations, wherein a resistivity of the second conductive ink of the second printed layer is less than a resistivity of the first conductive ink of the first printed layer.

Illustration 3. The touch sensor of any preceding or subsequent illustrations or combination of illustrations, wherein the second printed layer forms a continuous border around the touch area and does not cover the touch area.

Illustration 4. The touch sensor of any preceding or subsequent illustrations or combination of illustrations, wherein the touch sensor further comprises a radiative plane layer on the second surface of the support layer, and wherein the support layer comprises an electrically insulating substrate.

Illustration 5. The touch sensor of any preceding or subsequent illustrations or combination of illustrations, wherein the support layer is a first support layer comprising a flexible substrate, and wherein the touch sensor further comprises: an adhesive layer on the second surface of the first support layer, and a second support layer, wherein the second support layer is rigid relative to the first support layer and comprises a first surface and a second surface, and wherein the first support layer is assembled with the second support layer such that the adhesive layer contacts and joins the first support layer with the second support layer.

Illustration 6. The touch sensor of any preceding or subsequent illustrations or combination of illustrations, wherein the second support layer comprises an electrically insulating substrate.

Illustration 7. The touch sensor of any preceding or subsequent illustrations or combination of illustrations, further comprising at least one wire electrically connected to the second printed layer.

Illustration 8. A cursor control device for a vehicle, the cursor control device comprising: a housing; and a touch sensor supported on the housing, the touch sensor comprising: a support layer comprising a first surface and a second surface opposite from the first surface; a first printed layer comprising a first conductive ink, wherein the first printed layer is printed on the first surface of the support layer and comprises a printed surface opposite from the support layer, and wherein the printed surface of the first printed layer defines a touch area of the touch sensor; and a second printed layer comprising a second conductive ink, wherein the second printed layer is printed on the printed surface of the first printed layer and is electrically connected to the first printed layer, and wherein a resistivity of the second printed layer is less than a resistivity of the first printed layer.

Illustration 9. The cursor control device of any preceding or subsequent illustrations or combination of illustrations, wherein the second printed layer forms a continuous border around the touch area and does not cover the touch area.

Illustration 10. The cursor control device of any preceding or subsequent illustrations or combination of illustrations, wherein the support layer comprises an electrically insulating substrate.

Illustration 11. The cursor control device of any preceding or subsequent illustrations or combination of illustrations, wherein the touch sensor further comprises a radiative plane layer on the second surface of the support layer, wherein the radiative plane layer is electrically connected to the first printed layer and the second printed layer via the support layer.

Illustration 12. The cursor control device of any preceding or subsequent illustrations or combination of illustrations, wherein the touch sensor further comprises a protective layer, wherein the protective layer comprises an electrically insulating ink printed on the touch area of the first printed layer and within a border defined by the second printed layer.

Illustration 13. The cursor control device of any preceding or subsequent illustrations or combination of illustrations, wherein the support layer is a first support layer comprising a flexible substrate, and wherein the touch sensor further comprises: an adhesive layer on the second surface of the first support layer, a second support layer, wherein the second support layer is rigid relative to the first support layer and comprises a first surface and a second surface, and wherein the first support layer is assembled with the second support layer such that the adhesive layer contacts and joins the first support layer with the second support layer.

Illustration 14. The cursor control device of any preceding or subsequent illustrations or combination of illustrations, wherein the touch sensor further comprises a plurality of wires electrically connected to the second printed layer and extending away from the touch sensor.

Illustration 15. The cursor control device of any preceding or subsequent illustrations or combination of illustrations, wherein the housing further comprises: a base; a support surface extending upwards from the base at an oblique angle; and a palm support, wherein the touch sensor is supported on the support surface.

Illustration 16. A method of assembling a touch sensor for a cursor control device, the method comprising: providing a support layer comprising a first surface and a second surface opposite from the first surface; printing a first conductive ink on the first surface of the support layer, wherein printing the first conductive ink on the first surface forms a first printed layer comprising a printed surface, and wherein the printed surface defines a touch area of the touch sensor; and printing a second conductive ink on the printed surface as a border surrounding the touch area, wherein printing the second conductive ink forms a second printed layer, and wherein the second printed layer does not cover the touch area of the printed surface.

Illustration 17. The method of any preceding or subsequent illustrations or combination of illustrations, wherein providing the support layer comprises printing the support layer.

Illustration 18. The method of any preceding or subsequent illustrations or combination of illustrations, wherein printing at least one of the first conductive ink or the second conductive ink comprises at least one of contact printing or non-contact printing.

Illustration 19. The method of any preceding or subsequent illustrations or combination of illustrations, wherein the support layer is a first support layer comprising a flexible substrate with an adhesive layer on the second surface, and wherein the method further comprises: positioning the first support layer on a second support layer after printing the first conductive ink and after printing the second conductive ink on the first support layer, wherein the second support layer is rigid relative to the first support layer and comprises an electrically insulating substrate, and wherein positioning the first support layer comprises engaging the adhesive layer with the second support layer such that the adhesive layer joins the first support layer with the second support layer.

Illustration 20. The method of any preceding or subsequent illustrations or combination of illustrations, wherein printing the second conductive ink comprises printing the second conductive ink on the printed surface as a continuous border surrounding the touch area.

Illustration 21. A touch sensor for a cursor control device, the touch sensor comprising: a first layer comprising a touch area comprising conductive ink; and an adjacent second layer comprising a resistive border comprising conductive ink; and a third layer comprising electrically insulating material.

Illustration 22. The touch sensor of any preceding or subsequent illustrations or combination of illustrations, wherein the resistivity of the conductive ink is tunable or adjustable.

Illustration 23. The touch sensor of any preceding or subsequent illustrations or combination of illustrations, wherein the first layer and second layer are in electrical contact.

Illustration 24. The touch sensor of any preceding or subsequent illustrations or combination of illustrations, wherein the first layer comprises a plurality of sublayers, and wherein a topmost sublayer of the plurality of sublayers comprises an image or diffusing pattern to diffuse glare or yield a special surface appearance or feel.

Illustration 25. The touch sensor of any preceding or subsequent illustrations or combination of illustrations, wherein the third layer is the substrate and comprises a rigid material with a predetermined thickness.

Illustration 26. The touch sensor of any preceding or subsequent illustrations or combination of illustrations, wherein the third layer comprises a thin flexible material, with or without contact adhesive, which could be printed, die cut, or otherwise formed and applied to the target substrate later.

Illustration 27. The touch sensor of any preceding or subsequent illustrations or combination of illustrations, wherein the touch sensor has electrical connections (e.g., wire attachments).

Illustration 28. The touch sensor of any preceding or subsequent illustrations or combination of illustrations, wherein the electrical connections are made at corners of the touch sensor.

Illustration 29. The touch sensor of any preceding or subsequent illustrations or combination of illustrations, wherein the electrical connections comprise epoxied wires, and wherein the first layer and the second layer are supported on the third layer.

Illustration 30. The touch sensor of any preceding or subsequent illustrations or combination of illustrations, wherein the first layer is between the second layer and the third layer.

Illustration 31. The touch sensor of any preceding or subsequent illustrations or combination of illustrations, wherein the electrical connections comprise copper traces, and wherein the first layer and the second layer are supported on the third layer.

Illustration 32. The touch sensor of any preceding or subsequent illustrations or combination of illustrations, wherein the second layer is between the first layer and the third layer.

Illustration 33. The touch sensor of any preceding or subsequent illustrations or combination of illustrations, further comprising an insulating layer applied over a surface of the touch area.

Illustration 34. The touch sensor of any preceding or subsequent illustrations or combination of illustrations, wherein the third layer is an etched circuit board.

Illustration 35. The touch sensor of any preceding or subsequent illustrations or combination of illustrations, wherein a radiative plane is attached to a back side of the third layer.

Illustration 36. A touch sensor comprising: a first layer comprising touch area comprising conductive ink; and an adjacent second layer comprising a resistive border comprising conductive ink; and a third layer supporting the first layer and the second layer, wherein the touch sensor comprises electrical connections.

Illustration 37. The touch sensor of any preceding or subsequent illustrations or combination of illustrations, wherein the electrical connections comprise epoxied wires, and wherein the first layer and the second layer are supported on the third layer.

Illustration 38. The touch sensor of any preceding or subsequent illustrations or combination of illustrations, wherein the first layer is between the second layer and the third layer.

Illustration 39. The touch sensor of any preceding or subsequent illustrations or combination of illustrations, wherein the electrical connections comprise copper traces, and wherein the first layer and the second layer are supported on the third layer.

Illustration 40. The touch sensor of any preceding or subsequent illustrations or combination of illustrations, wherein the second layer is between the first layer and the third layer.

Different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications may be made without departing from the scope of the claims below.

That which is claimed is:

1. A touch sensor for a cursor control device, the touch sensor comprising:
   a support layer comprising a first surface and a second surface opposite from the first surface;
   a first printed layer comprising a first conductive ink, wherein the first printed layer is printed on the first surface of the support layer and comprises a printed surface opposite from the support layer, and wherein the printed surface of the first printed layer defines a touch area of the touch sensor; and
   a second printed layer comprising a second conductive ink, wherein the second printed layer is printed on the printed surface of the first printed layer and is electrically connected to the first printed layer, and wherein the second printed layer forms a border around the touch area.

2. The touch sensor of claim 1, wherein a resistivity of the second conductive ink of the second printed layer is less than a resistivity of the first conductive ink of the first printed layer.

3. The touch sensor of claim 1, wherein the second printed layer forms a continuous border around the touch area and does not cover the touch area.

4. The touch sensor of claim 1, wherein the touch sensor further comprises a radiative plane layer on the second surface of the support layer, and wherein the support layer comprises an electrically insulating substrate.

5. The touch sensor of claim 1,
   wherein:
      the support layer comprises a first support layer and second support layer;
      the first support layer comprising a flexible substrate; and
      the second support layer is rigid relative to the first support layer; and
   the touch sensor further comprises an adhesive layer on the second surface of the first support layer.

6. The touch sensor of claim 5, wherein the second support layer comprises an electrically insulating substrate.

7. The touch sensor of claim 1, further comprising at least one wire electrically connected to the second printed layer.

8. A cursor control device for a vehicle, the cursor control device comprising:
   a housing; and
   a touch sensor supported on the housing, the touch sensor comprising:
   a support layer comprising a first surface and a second surface opposite from the first surface;
   a first printed layer comprising a first conductive ink, wherein the first printed layer is printed on the first surface of the support layer and comprises a printed surface opposite from the support layer, and wherein the printed surface of the first printed layer defines a touch area of the touch sensor; and
   a second printed layer comprising a second conductive ink, wherein the second printed layer is printed on the printed surface of the first printed layer and is electrically connected to the first printed layer, and wherein a resistivity of the second printed layer is less than a resistivity of the first printed layer.

9. The cursor control device of claim 8, wherein the second printed layer forms a continuous border around the touch area and does not cover the touch area.

10. The cursor control device of claim 8, wherein the support layer comprises an electrically insulating substrate.

11. The cursor control device of claim 10, wherein the touch sensor further comprises a radiative plane layer on the second surface of the support layer, wherein the radiative plane layer is electrically connected to the first printed layer and the second printed layer via the support layer.

12. The cursor control device of claim 8, wherein the touch sensor further comprises a protective layer, wherein the protective layer comprises an electrically insulating ink printed on the touch area of the first printed layer and within a border defined by the second printed layer.

13. The cursor control device of claim 8,
wherein:
the support layer comprises a first support layer and a second support layer;
the first support layer comprising a flexible substrate; and
the second support layer is rigid relative to the first support layer; and
wherein the touch sensor further comprises an adhesive layer on the second surface of the first support layer.

14. The cursor control device of claim 8, wherein the touch sensor further comprises a plurality of wires electrically connected to the second printed layer and extending away from the touch sensor.

15. The cursor control device of claim 8, wherein the housing further comprises:
a base;
a support surface extending upwards from the base at an oblique angle; and
a palm support,
wherein the touch sensor is supported on the support surface.

16. A method of assembling a touch sensor for a cursor control device, the method comprising:
providing a support layer comprising a first surface and a second surface opposite from the first surface;
printing a first conductive ink on the first surface of the support layer, wherein printing the first conductive ink on the first surface forms a first printed layer comprising a printed surface, and wherein the printed surface defines a touch area of the touch sensor; and
printing a second conductive ink on the printed surface as a border surrounding the touch area, wherein printing the second conductive ink forms a second printed layer, and wherein the second printed layer does not cover the touch area of the printed surface.

17. The method of claim 16, wherein providing the support layer comprises printing the support layer.

18. The method of claim 16, wherein printing at least one of the first conductive ink or the second conductive ink comprises at least one of contact printing or non-contact printing.

19. The method of claim 16,
wherein:
the support layer comprises a first support layer and a second support layer;
the first support layer comprising a flexible substrate; and
the second support layer is rigid relative to the first support layer and comprises
an insulating substrate; and
the method further comprises:
providing an adhesive layer on the second surface of the first support layer; and
positioning the first support layer on a second support layer after printing the first conductive ink and after printing the second conductive ink on the first support layer.

20. The method of claim 16, wherein printing the second conductive ink comprises printing the second conductive ink on the printed surface as a continuous border surrounding the touch area.

* * * * *